United States Patent
Jung et al.

(10) Patent No.: US 11,888,486 B2
(45) Date of Patent: Jan. 30, 2024

(54) HIGH RESOLUTION PHASE CORRECTING CIRCUIT AND PHASE INTERPOLATING DEVICE

(71) Applicant: Samsung Electronics Co., Ltd., Suwon-si (KR)

(72) Inventors: Jinook Jung, Suwon-si (KR); Jaewoo Park, Yongin-si (KR); Myoungbo Kwak, Seoul (KR); Junghwan Choi, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/872,527

(22) Filed: Jul. 25, 2022

(65) Prior Publication Data
US 2023/0099738 A1    Mar. 30, 2023

(30) Foreign Application Priority Data
Sep. 29, 2021  (KR) .......................... 10-2021-0128915

(51) Int. Cl.
*H03K 5/00* (2006.01)
*H03K 5/01* (2006.01)
*H03H 11/16* (2006.01)

(52) U.S. Cl.
CPC .............. *H03K 5/01* (2013.01); *H03H 11/16* (2013.01); *H03K 2005/00019* (2013.01)

(58) Field of Classification Search
CPC . H03K 5/01; H03K 2005/00019; H03H 11/16
USPC ....................................................... 327/237
See application file for complete search history.

(56) References Cited

U.S. PATENT DOCUMENTS

| | | | | |
|---|---|---|---|---|
| 5,138,204 A | * | 8/1992 | Imamura ................. | H03K 5/13 327/263 |
| 5,307,028 A | * | 4/1994 | Chen ....................... | H03L 7/085 331/25 |
| 5,946,268 A | * | 8/1999 | Iwamoto ................ | H03K 5/133 365/194 |
| 6,061,279 A | * | 5/2000 | Toda ....................... | G11C 27/024 365/45 |
| 6,181,184 B1 | * | 1/2001 | Yamazaki .............. | H03K 5/131 327/394 |

(Continued)

FOREIGN PATENT DOCUMENTS

| | | |
|---|---|---|
| CN | 107659308 A | 2/2018 |
| KR | 101747176 B1 | 6/2017 |

*Primary Examiner* — Ryan Jager
(74) *Attorney, Agent, or Firm* — Myers Bigel, P.A.

(57) ABSTRACT

A phase correcting circuit includes a delay circuit that receives an input clock signal and delays the input clock signal as much as a first delay time to output an output clock signal to a 0-th node, a first fine tuning circuit, and a second fine tuning circuit. The first fine tuning circuit includes a first terminal connected with the 0-th node, a second terminal receiving a first control signal, and a third terminal, and the second fine tuning circuit includes a fourth terminal connected with the third terminal, a fifth terminal receiving a second control signal, and a sixth terminal connected with a load capacitor. In response to the first control signal, the output clock signal may be further delayed as much as a second delay time shorter than the first delay time. In response to the second control signal, the output clock signal may be advanced as much as a third delay time shorter than the first delay time.

18 Claims, 12 Drawing Sheets

(56) References Cited

U.S. PATENT DOCUMENTS

| | | | | |
|---|---|---|---|---|
| 6,212,126 | B1* | 4/2001 | Sakamoto | H03L 7/0814 |
| | | | | 365/233.5 |
| 6,229,363 | B1* | 5/2001 | Eto | G11C 7/22 |
| | | | | 327/158 |
| 6,259,294 | B1* | 7/2001 | Murakami | H03K 5/131 |
| | | | | 327/277 |
| 6,339,353 | B1* | 1/2002 | Tomita | H03K 3/356121 |
| | | | | 327/210 |
| 6,973,001 | B1* | 12/2005 | Tomita | G11C 7/222 |
| | | | | 365/194 |
| 6,998,897 | B2 | 2/2006 | Pilo et al. | |
| 7,135,906 | B2 | 11/2006 | Takai et al. | |
| 7,190,202 | B1* | 3/2007 | Oh | H03L 7/0816 |
| | | | | 327/158 |
| 7,952,410 | B2* | 5/2011 | Yamanaka | H03L 7/0805 |
| | | | | 327/272 |
| 8,008,954 | B2 | 8/2011 | Ma | |
| 8,531,898 | B2 | 9/2013 | Seol et al. | |
| 10,784,779 | B2 | 9/2020 | Miller | |
| 11,563,427 | B2* | 1/2023 | Kuzmenka | H03F 3/45179 |
| 2002/0140484 | A1* | 10/2002 | Komura | H03K 5/133 |
| | | | | 327/276 |
| 2013/0012807 | A1* | 1/2013 | Al-Sunni | A61B 34/20 |
| | | | | 600/424 |
| 2014/0072025 | A1* | 3/2014 | Matsudaira | H04B 5/0075 |
| | | | | 375/232 |
| 2016/0363657 | A1* | 12/2016 | Nakagawa | G01S 7/52025 |
| 2020/0241331 | A1* | 7/2020 | Tatsumi | H03F 3/68 |

* cited by examiner

HIGH RESOLUTION PHASE CORRECTING CIRCUIT AND PHASE INTERPOLATING DEVICE

REFERENCE TO PRIORITY APPLICATION

This application claims priority to Korean Patent Application No. 10-2021-0128915, filed Sep. 29, 2021, the disclosure of which is hereby incorporated herein by reference.

BACKGROUND

Embodiments of the present disclosure described herein relate to integrated circuit devices, and, more particularly, to integrated circuit memory devices with enhanced clock signal timing.

Semiconductor devices such as a processor and a memory operate in response to a toggle period of a clock signal. For example, a semiconductor device may parse a communication signal of another device in synchronization with a timing at which the clock signal toggles. When a phase difference is present between the clock signal and the communication signal, the phase difference may cause an error of a communication signal that is transmitted/received by the semiconductor device.

As an operating speed of the semiconductor device becomes higher, the toggle period of the clock signal may become shorter. With a decrease in the toggle period of the clock signal, there is an ongoing need to tune the phase of the clock signal(s) more finely.

SUMMARY

Embodiments of the present disclosure provide a high resolution phase correcting circuit and a phase interpolating device capable of finely correcting a phase of a clock signal.

According to an embodiment, a phase correcting circuit may include a delay circuit that receives an input clock signal and delays the input clock signal as much as a first delay time to output an output clock signal to a 0-th node. A first fine tuning circuit may be provided that includes a first terminal connected with the 0-th node, a second terminal configured to receive a first control signal, and a third terminal. A second fine tuning circuit may be provided that includes a fourth terminal connected with the third terminal, a fifth terminal configured to receive a second control signal, and a sixth terminal connected with a load capacitor. In response to the first control signal, the output clock signal may be further delayed as much as a second delay time shorter than the first delay time. In response to the second control signal, the output clock signal may be advanced as much as a third delay time shorter than the first delay time.

According to an embodiment, a phase correcting circuit may include: (i) a delay circuit that receives an input clock signal and delays the input clock signal as much as a first delay time to output an output clock signal to a 0-th node, (ii) a load capacitor, and (iii) one or more fine tuning circuits connected in series between the 0-th node and the load capacitor. Each of the one or more fine tuning circuits may include an input terminal, a control terminal, and an output terminal. The input terminal may be connected with the 0-th node or an output terminal of a previous fine tuning circuit, the control terminal may receive a control signal, and the output terminal may be connected with an input terminal of a next fine tuning circuit or the load capacitor. In response to the control signal, a phase of the output clock signal may be tuned as much as a second delay time shorter than the first delay time.

According to an embodiment, a phase interpolating device may include a decoder that generates a first control signal and a second control signal based on a phase difference of a clock signal and a reference signal, a phase shift unit that includes a plurality of phase correction circuits connected in series, and a phase select unit. Each of the plurality of phase correction circuits may include: (i) a delay circuit that receives an input clock signal and delays the input clock signal as much as a first delay time to output an output clock signal to an output node, (ii) a first fine tuning circuit that includes a first terminal connected with the output node, a second terminal receiving the first control signal, and a third terminal, and (iii) a second fine tuning circuit that includes a fourth terminal connected with the third terminal, a fifth terminal receiving the second control signal, and a sixth terminal connected with a load capacitor. In response to the first control signal, the output clock signal may be further delayed as much as a second delay time shorter than the first delay time. In response to the second control signal, the output clock signal may be advanced as much as a third delay time shorter than the first delay time. The phase select unit may determine whether to select, as a corrected clock signal, an output clock signal output from the delay circuit of each of the plurality of phase correction circuits, based on the phase difference

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure will be described in detail and clearly to such an extent that one skilled in the art may readily carry out the teachings of the present disclosure. In the following description, specific details such as detailed components and structures are merely provided to assist the overall understanding of embodiments of the present disclosure. Therefore, it should be apparent to those skilled in the art that various changes and modifications of the embodiments described herein may be made without departing from the scope and spirit of the invention. In addition, the descriptions of well-known functions and structures are omitted for clarity and brevity. In the following drawings or in the detailed description, components may be connected with any other components except for components illustrated in a drawing or described in the detailed description. The terms described in the specification are terms defined in consideration of the functions in the present disclosure and are not limited to a specific function. The definitions of the terms should be determined based on the contents throughout the specification.

Components that are described in the detailed description with reference to the terms "block", "module", "unit", etc. may be implemented with software, hardware, or a combination thereof. For example, the software may be a machine code, firmware, an embedded code, and application software. For example, the hardware may include an electrical circuit, an electronic circuit, a processor, a computer, integrated circuit cores, a pressure sensor, an inertial sensor, a micro electro-mechanical system (MEMS), a passive element, or a combination thereof.

Figure 1:
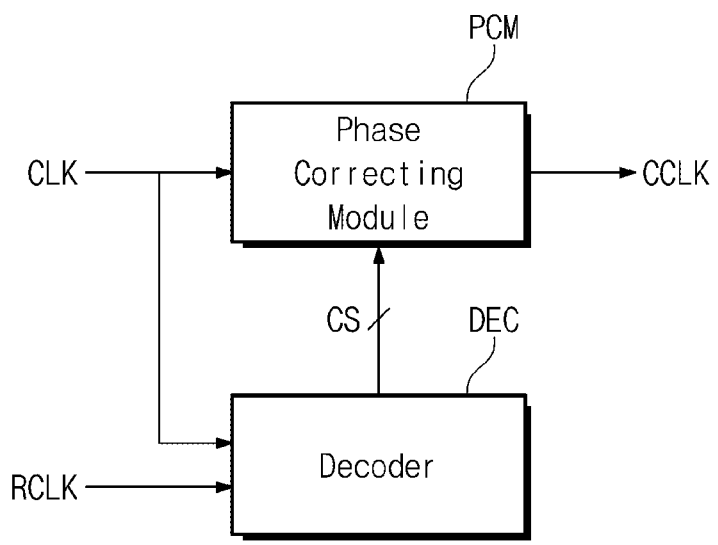
FIG. 1 is a block diagram illustrating a phase interpolating device according to an embodiment of the present disclosure.

FIG. 1 is a block diagram illustrating a phase interpolating device according to an embodiment of the present disclosure. Referring to FIG. 1, a phase interpolating device 1000 may include a decoder DEC and a phase correcting module PCM. The phase correcting module PCM may receive a clock signal CLK and a control signal CS, and may correct the clock signal CLK in response to the control signal CS. For example, the phase correcting module PCM may delay or lead (i.e., advance) a phase of the clock signal CLK, and output a corrected clock signal CCLK.

In an embodiment, the correction for advancing a phase of a clock signal may correspond to the correction for delaying the phase of the clock signal. For example, the correction for delaying the phase of the clock signal may mean adding a positive phase to the phase of the clock signal. The correction for advancing the phase of the clock signal may mean adding a negative phase to the phase of the clock signal.

The decoder DEC may receive the clock signal CLK and a reference signal RCLK. The decoder DEC may generate the control signal CS based on an evaluation of the clock signal CLK and the reference signal RCLK. For example, the decoder DEC may generate the control signal CS based on a phase difference between the clock signal CLK and the reference signal RCLK, and may provide the phase correcting module PCM with the control signal CS thus generated.

In an embodiment, the phase of the corrected clock signal CCLK may be determined based on the phase of the reference signal RCLK. A relationship between the clock signal CLK, the corrected clock signal CCLK, and the reference signal RCLK will be described in detail with reference to FIG. 2.

In an embodiment, the clock signal CLK may be a signal generated by an oscillator circuit (not illustrated), or a phase locked loop (PLL) circuit (not illustrated), for example. However, the present disclosure is not limited thereto. For example, the clock signal CLK may be provided from various components capable of generating or transferring a clock signal, including a digital delay line.

In an embodiment, the reference signal RCLK may be a signal including a jitter, a delay, or the like. In this case, the reference signal RCLK may be a signal including a skew with respect to the clock signal CLK. The corrected clock signal CCLK may be a signal experiencing the correction for matching the phase of the clock signal CLK based on the phase of the reference signal RCLK.

Figure 2:
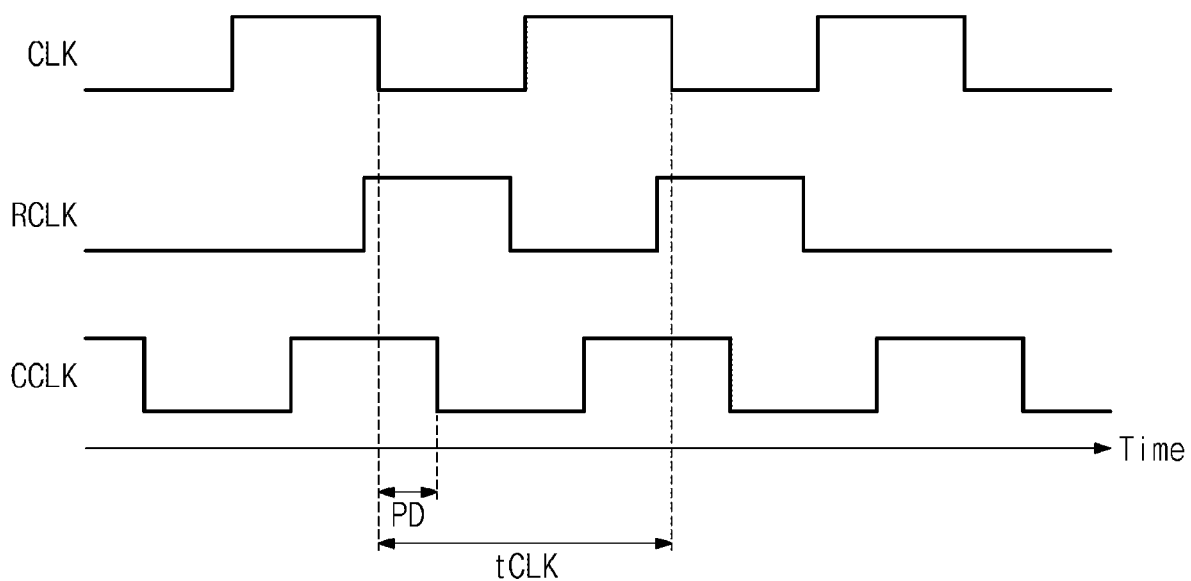
FIG. 2 is a timing diagram illustrating an example of an operation of a phase interpolating device of FIG. 1.

FIG. 2 is a timing diagram illustrating an example of an operation of a phase interpolating device of FIG. 1. A horizontal axis of FIG. 2 represents a time. A vertical axis of FIG. 2 represents a logic level of the clock signal CLK, the reference signal RCLK, or the corrected clock signal CCLK, as shown. In an embodiment, the clock signal CLK, the reference signal RCLK, and the corrected clock signal CCLK may be a binary digital signal whose voltage level is classified as either a high level or a low level. Moreover, in an embodiment, a logical value of the reference signal RCLK may be detected at a point in time when a rising edge or a falling edge of the clock signal CLK is formed.

Referring to FIGS. 1 and 2, points in time when the rising edge and the falling edge of the clock signal CLK occur may not be center-aligned with the window of the reference signal RCLK. In this case, there may be an increase in the probability that an error may occur at a logical value of the reference signal RCLK, which is detected at a point in time when the rising edge or the falling edge of the clock signal CLK occurs. The phase interpolating device 1000 may correct the phase of the clock signal CLK. For example, the phase interpolating device 1000 may perform correction such that the phase of the clock signal CLK is delayed as much as a delay phase PD. That is, the phase interpolating device 1000 may generate the corrected clock signal CCLK to be center-aligned with the window of the reference signal RCLK at the rising edge and the falling edge, as shown. As used herein, the delay phase PD may mean a delay time by which a signal is delayed through correction.

In an embodiment, in the case where the rising edge and the falling edge of the clock signal CLK is center-aligned with the window of the reference signal RCLK, the phase interpolating device 1000 may not perform interpolation on the clock signal CLK. In this case, the clock signal CLK and the corrected clock signal CCLK may be the same signal.

For brief description, an embodiment in which the corrected clock signal CCLK is generated by delaying the phase of the clock signal CLK is illustrated in FIG. 2. However, the present disclosure is not limited thereto. For example, the phase interpolating device 1000 may generate the corrected clock signal CCLK by advancing, in time, the phase of the clock signal CLK.

In an embodiment, with the trend that a toggling period tCLK of a clock signal decreases, the decrease in the delay phase PD is required. That is, a phase interpolating device capable of finely tuning the delay phase PD is required. According to the technical idea of the present disclosure, the high resolution phase interpolating device 1000 capable of turning the delay phase PD finely may be provided. A configuration of the high resolution phase interpolating device 1000 will be described in detail with reference to the following drawings.

Figure 3:
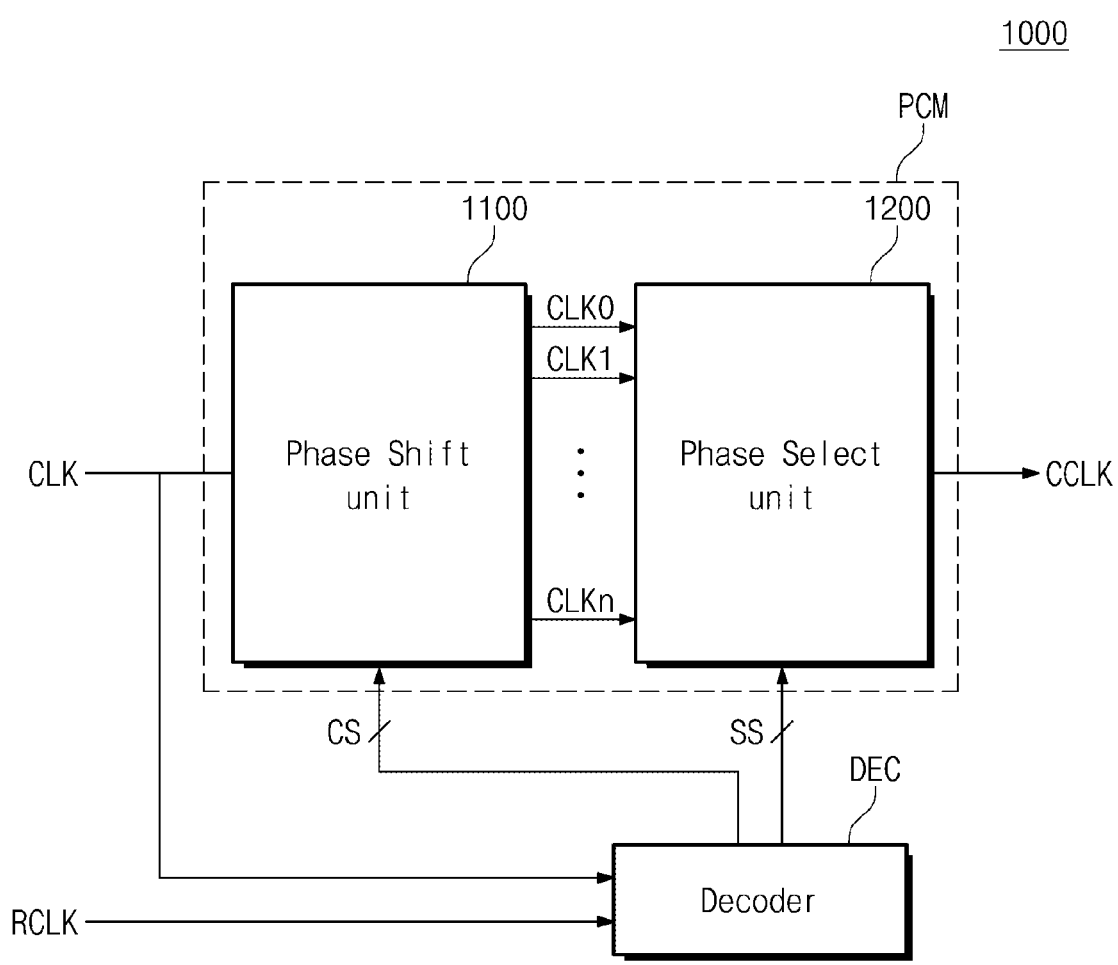
FIG. 3 is a block diagram illustrating a phase interpolating device implemented according to an embodiment of the present disclosure in detail.

FIG. 3 is a block diagram illustrating a phase interpolating device implemented according to an embodiment of the present disclosure in detail. Referring to FIGS. 1 and 3, the phase interpolating device 1000 may include the phase correcting module PCM and the decoder DEC. For brief description, additional description associated with the functions of the phase correcting module PCM and the decoder DEC described with reference to FIG. 1 will be omitted to avoid redundancy.

As shown by FIG. 3, the phase correcting module PCM may include a phase shift unit 1100 and a phase select unit 1200. The phase shift unit 1100 may receive the clock signal CLK, and may receive the control signal CS from the decoder DEC. In response to these two signals, the phase shift unit 1100 may output 0-th to n-th clock signals CLK0 to CLKn.

In an embodiment, the control signal CS may be a signal that is provided to finely adjust the degree of phase tuning of the phase shift unit 1100. The phase shift unit 1100 may finely tune phases of the 0-th to n-th clock signals CLK0 to CLKn in response to the control signal CS. An operation in which the phase shift unit 1100 finely tunes a phase in response to the control signal CS will be described in detail with reference to FIGS. 4 to 13.

In an embodiment, the 0-th to n-th clock signals CLK0 to CLKn may have different phases. For example, the 0-th clock signal CLK0 may be the same signals as the clock signal CLK, the first clock signal CLK1 may be a signal that is obtained by delaying the phase of the clock signal CLK as much as about "a" degree, and the n-th clock signal CLKn may be a signal that is obtained by delaying the phase of the clock signal CLK as much as about n times the "a" degree. However, the present disclosure is not limited thereto. The phase shift unit 1100 may output various clock signals whose phases are shifted as much as different magnitudes.

In an embodiment, the control signal CS may be implemented as a multi-bit digital signal, and the phase shift unit 1100 may be implemented to delay or advance a phase of a clock signal CLK in response to that the control signal CS. In an embodiment, the control signal CS may be implemented with a digital signal whose duty cycle or duty ratio is adjusted. For example, the control signal CS may be implemented through a pulse width modulation (PWM) manner. In an embodiment, the control signal CS may be implemented to provide a voltage that is capable of varying continuously (e.g., a voltage of an analog manner).

Below, an embodiment in which the control signal CS is implemented with a digital signal will be described. However, the present disclosure is not limited thereto. The phase interpolating device 1000 that operates in response to various types of control signals may be provided. For example, referring to an embodiment to be described with reference to FIG. 12, the control signal CS may be implemented in a pulse width modulation (PWM) manner or an analog manner.

Next, the phase select unit 1200 may receive the clock signals CLK0 to CLKn (having different phases) from the phase shift unit 1100. The phase select unit 1200 may receive a phase select signal SS from the decoder DEC, and may select one of the clock signals CLK0 to CLKn in response to the phase select signal SS. For example, when the phase select signal SS does not indicate an additional phase delay, the phase select unit 1200 may select the 0-th clock signal CLK0 as the output clock signal CCLK. As in the above description, the phase select unit 1200 may select one of the clock signals CLK0 to CLKn of various phases as the clock signal CCLK in response to the value of the phase select signal SS, which may be a multi-bit digital signal. In an embodiment, the phase select signal SS may include information about a phase difference of the clock signal CLK and the reference signal RCLK. That is, the phase select signal SS may be a signal indicating a desired magnitude of phase correction to be applied to the clock signal CLK.

For brief description, an embodiment in which the phase shift unit 1100 and the phase select unit 1200 are separate components independently of each other is illustrated in FIG. 3, but the present disclosure is not limited thereto. For example, the phase correcting module PCM may function as one independent component as illustrated in FIG. 3.

Figure 4:
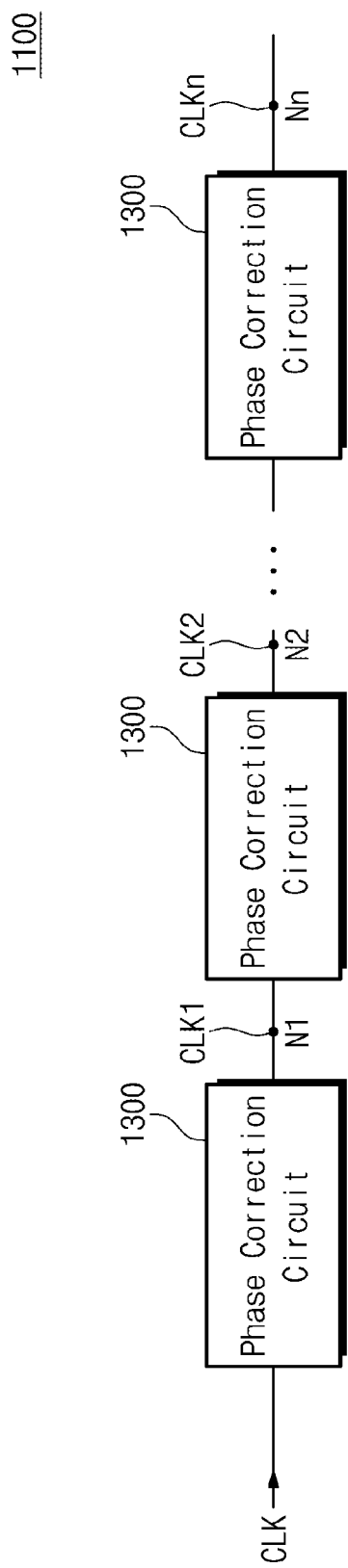
FIG. 4 is a block diagram illustrating a phase shift unit of FIG. 3 in detail.

FIG. 4 is a block diagram illustrating an embodiment of the phase shift unit of FIG. 3, in detail. Referring to FIGS. 3 and 4, the phase shift unit 1100 may include a plurality of phase correction circuits 1300. For brief description, an embodiment in which the phase correction circuits 1300 are connected in series is illustrated in FIG. 4, but the present disclosure is not limited thereto. For example, the phase correction circuits 1300 may be implemented in a series manner, in a parallel manner, or a combination thereof.

As shown, each of the plurality of phase correction circuits 1300 may correct a signal input thereto. For example, each of the plurality of phase correction circuits 1300 may include a component, which causes a phase delay of a signal, such as a buffer or an inverter. Each of the plurality of phase correction circuits 1300 may further include a component such as a capacitor, a switch, a transistor, a NAND gate, an amplifier, or a variable gain amplifier (VGA), for the purpose of fine-turning a phase. A configuration of the phase correction circuit 1300 will be described in detail with reference to FIGS. 5 to 12.

The phase shift unit 1100 may output the different clock signals CLK0 to CLKn depending on the number of phase correction circuits 1300 through which the clock signal CLK passes. For example, the phase shift unit 1100 may output the clock signal CLK as the 0-th clock signal CLK0, and may output the first clock signal CLK1 as a signal generated when the clock signal CLK passes through a first phase correction circuit 1300. The phase shift unit 1100 may also output the n-th clock signal CLKn (e.g., at node Nn) when the clock signal CLK passes through a series of "n" phase correction circuits 1300.

Figure 5A:
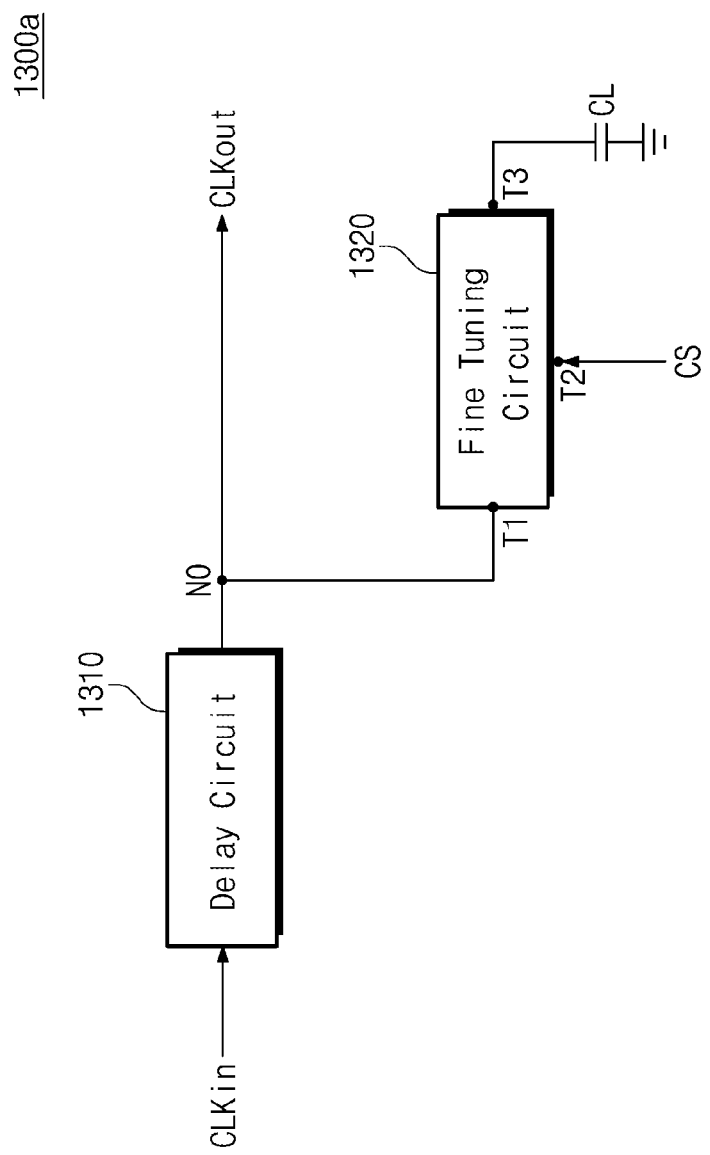
FIGS. 5A and 5B are block diagrams illustrating alternative phase correction circuits of FIG. 4 in detail.
Figure 5B:
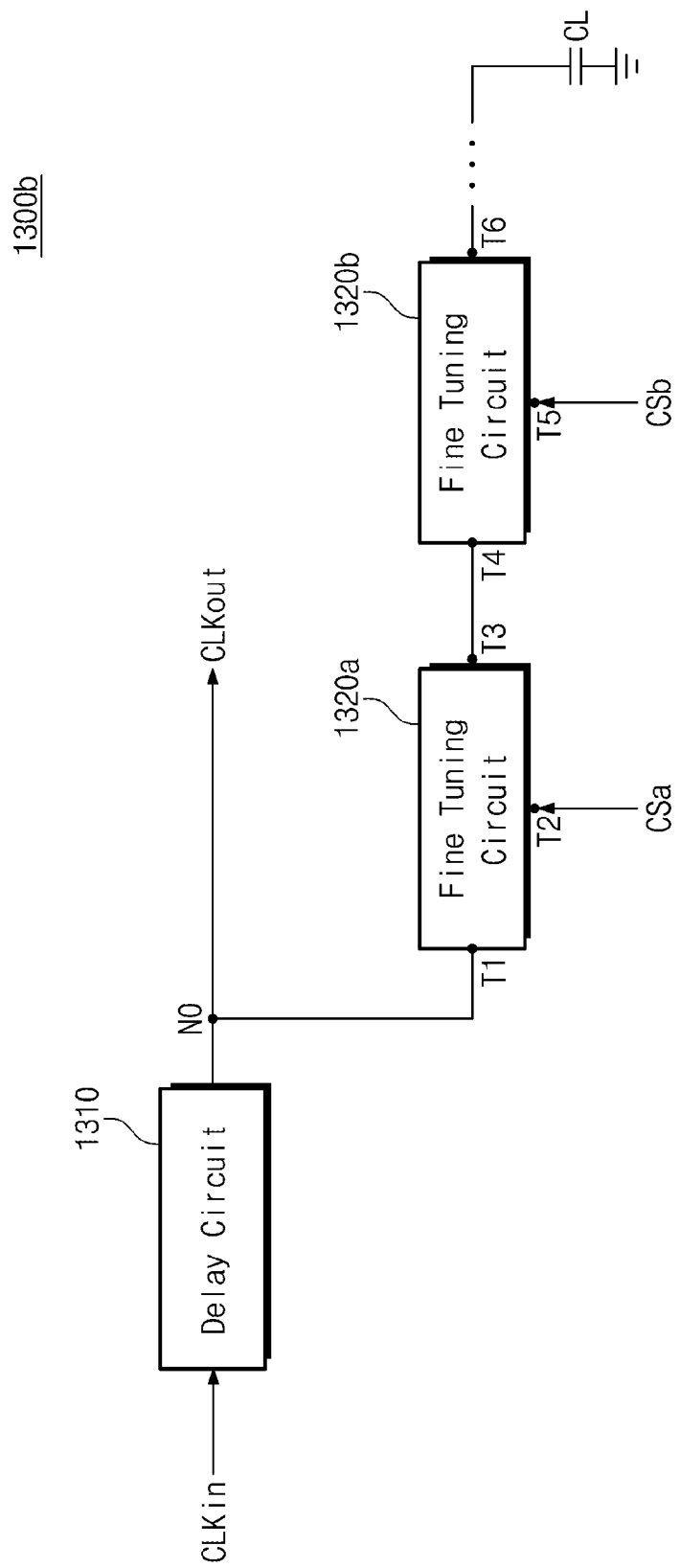

FIGS. 5A and 5B are block diagrams illustrating a phase correction circuit of FIG. 4 in detail. Referring to FIGS. 4, 5A, and 5B, the phase correction circuits 1300 may include a delay circuit 1310 and one or more fine tuning circuits 1320. For brief description, a phase correction circuit 1300a including one fine tuning circuit 1320 will be described with reference to FIG. 5A, and a phase correction circuit 1300b including two or more fine tuning circuits 1320a and 1320b will be described with reference to FIG. 5B.

Referring to FIGS. 3, 4, and 5A, the phase correction circuit 1300a may receive an input clock signal CLKin. The phase correction circuit 1300a may output an output clock signal CLKout to an output node. The output clock signal CLKout may be a signal that is obtained by adding a phase delay and performing phase fine tuning on the input clock signal CLKin. In an embodiment, the input clock signal CLKin and the output clock signal CLKout may be associated with each of the plurality of clock signals CLK0 to CLKn illustrated in FIG. 4. For example, in the case where the input clock signal CLKin corresponds to the clock signal CLK or the 0-th clock signal CLK0, the output clock signal CLKout may correspond to the first clock signal CLK1. But, in the case where the input clock signal CLKin corresponds to the first clock signal CLK1, the output clock signal CLKout may correspond to the second clock signal CLK2.

The delay circuit 1310 may output a signal, which is obtained by delaying a phase of the input clock signal CLKin, to the 0-th node NO. In an embodiment, the delay circuit 1310 may include various semiconductor components for delaying the input clock signal CLKin, such as an inverter and a buffer (e.g., two inverters in series).

In contrast, the fine tuning circuit 1320 may include a first terminal T1 connected with the 0-th node NO, a second terminal T2 receiving the control signal CS, and a third terminal T3. The third terminal T3 may be connected with a load capacitor CL. The fine tuning circuit 1320 may tune a phase of a signal, which is output from the delay circuit 1310 to the 0-th node NO, in response to the control signal CS. For example, in response to the control signal CS, the fine tuning circuit 1320 may finely delay or advance the phase of the signal output from the delay circuit 1310 to the 0-th node NO. An operation of the fine tuning circuit 1320 that operates in response to the control signal CS will be described in detail with reference to FIGS. 6 to 12.

Referring to FIGS. 3, 4, and 5B, the phase correction circuit 1300b may include the delay circuit 1310, the first fine tuning circuit 1320a, and the second fine tuning circuit 1320b. The phase correction circuit 1300b may correct the input clock signal CLKin and may output the output clock signal CLKout to the output node. Functions and operations of the delay circuit 1310, the first and second fine tuning circuits 1320a and 1320b, the output node, the input clock signal CLKin, and the output clock signal CLKout are described in detail with reference to FIG. 5A, and thus, additional description will be omitted to avoid redundancy.

The first fine tuning circuit 1320a may include the first terminal T1 connected with the 0-th node NO, the second terminal T2 receiving a first control signal CSa, and the third terminal T3. The second fine tuning circuit 1320b may include a fourth terminal T4 connected with the third terminal T3, a fifth terminal T5 receiving a second control signal CSb, and a sixth terminal T6. Thus, in the illustrated embodiment, the phase correction circuit 1300b may include the two fine tuning circuits 1320a and 1320b. In this case, the sixth terminal T6 may be connected with the load capacitor CL.

The first and second fine tuning circuits 1320a and 1320b may tune a phase of a signal, which is output from the delay circuit 1310 to the 0-th node NO, in response to the first and second control signals CSa and CSb. For example, when the first control signal CSa is activated, the first fine tuning circuit 1320a may delay the phase of the signal output from the delay circuit 1310 to the 0-th node NO as much as a first phase. And, when the second control signal CSb is activated, the second fine tuning circuit 1320b may advance the phase of the signal output from the delay circuit 1310 to the 0-th node NO as much as a second phase. In this case, a magnitude of the second phase may be smaller than a magnitude of the first phase. An operation of the first and second fine tuning circuits 1320a and 1320b that operate in response to the first and second control signals CSa and CSb will be described in detail with reference to FIGS. 7 to 12.

In an embodiment, the phase correction circuit 1300b may include three or more fine tuning circuits. In this case, the sixth terminal T6 may be connected with a third fine tuning circuit (not illustrated). As in the above description, the phase correction circuit 1300b may include a plurality of fine tuning circuits connected in series. For example, the phase correction circuit 1300b may include one or more fine tuning circuits connected in series between the 0-th node NO and the load capacitor CL. Each of the one or more fine tuning circuits may include an input terminal, a control terminal, and an output terminal. The input terminal may be connected with the 0-th node or the output terminal of a previous fine tuning circuit. The control terminal may receive a control signal. The output terminal may be connected with the input terminal of a next fine tuning circuit or the load capacitor CL. That is, the present disclosure is not limited to the number of fine tuning circuits included in a phase correction circuit.

In an embodiment, a magnitude of the load capacitor CL may be appropriately determined depending on a magnitude of a phase to be corrected in response to the activation of control signals. Also, unlike the examples illustrated in FIGS. 5A and 5B, a load capable of being connected with a fine tuning circuit is not limited to a capacitive load. For example, a load capable of being connected with the third terminal T3 of FIG. 5A or the sixth terminal T6 of FIG. 5B may include a resistive load, a capacitive load, an inductive load, and/or a combination thereof.

Figure 6:
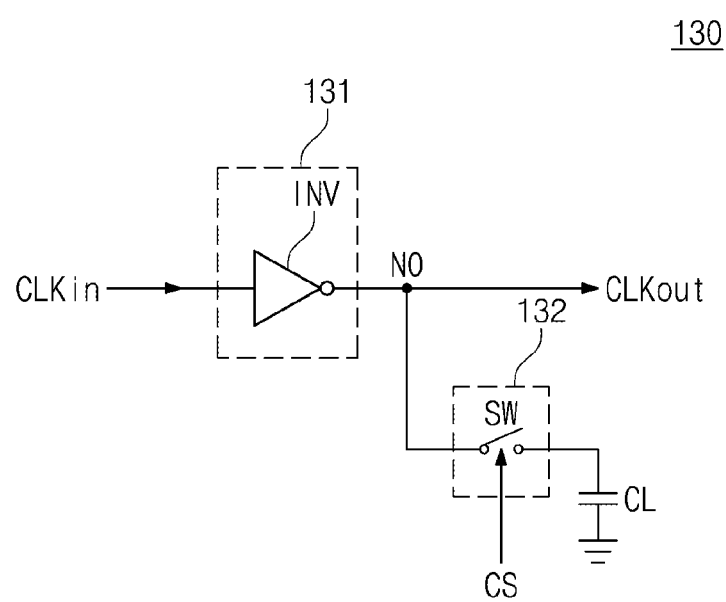
FIG. 6 illustrates a circuit diagram in which a phase correction circuit of FIG. 5A is implemented.

FIG. 6 illustrates a circuit diagram in which a phase correction circuit of FIG. 5A is implemented. Referring to FIGS. 5A and 6, a phase correction circuit 130 may include a delay circuit 131 and a fine tuning circuit 132. The delay circuit 131 may include a single inverter INV, which provides a 180° delay. The functions and the operations of the phase correction circuit 130, the delay circuit 131, and the fine tuning circuit 132 are similar to those of the phase correction circuit 1300, the delay circuit 1310, and the fine tuning circuit 1320 of FIG. 5A, and thus, additional description will be omitted to avoid redundancy.

The fine tuning circuit 132 may include a switch SW. The switch SW may be turned on or turned off in response to the control signal CS. For example, the switch SW may be implemented with a p-channel metal oxide semiconductor (PMOS) transistor or an n-channel metal oxide semiconductor (NMOS) transistor (or a parallel combination of a PMOS transistor and an NMOS transistor, as a transmission gate). In this case, the control signal CS may be input to a gate terminal of the PMOS transistor or the NMOS transistor.

The fine tuning circuit 132 may tune a phase of a signal that is output from the delay circuit 131 to the 0-th node NO. For example, when the control signal CS is activated, the switch SW may be turned on, and thus, the load capacitor CL may be connected with the 0-th node NO. In this case, compared to the case where the load capacitor CL is not connected with the 0-th node NO, a time constant seen from the delay circuit 131 to the 0-th node NO may increase. Accordingly, the phase of the output clock signal CLKout may be tuned in response to activation of the control signal CS.

In an embodiment, the fine tuning circuit 132 including the switch SW may be relatively difficult to implement to thereby provide accurate fine-tuning of the input clock signal CLKin. For example, the fine tuning circuit 132 may be difficult to control the influence of a switch resistance, a parasitic capacitance, or the like. A fine tuning circuit in which the influence of a switch resistance, a parasitic capacitance, or the like is reduced or minimized will be described in detail with reference to FIGS. 7 to 12.

Figure 7:
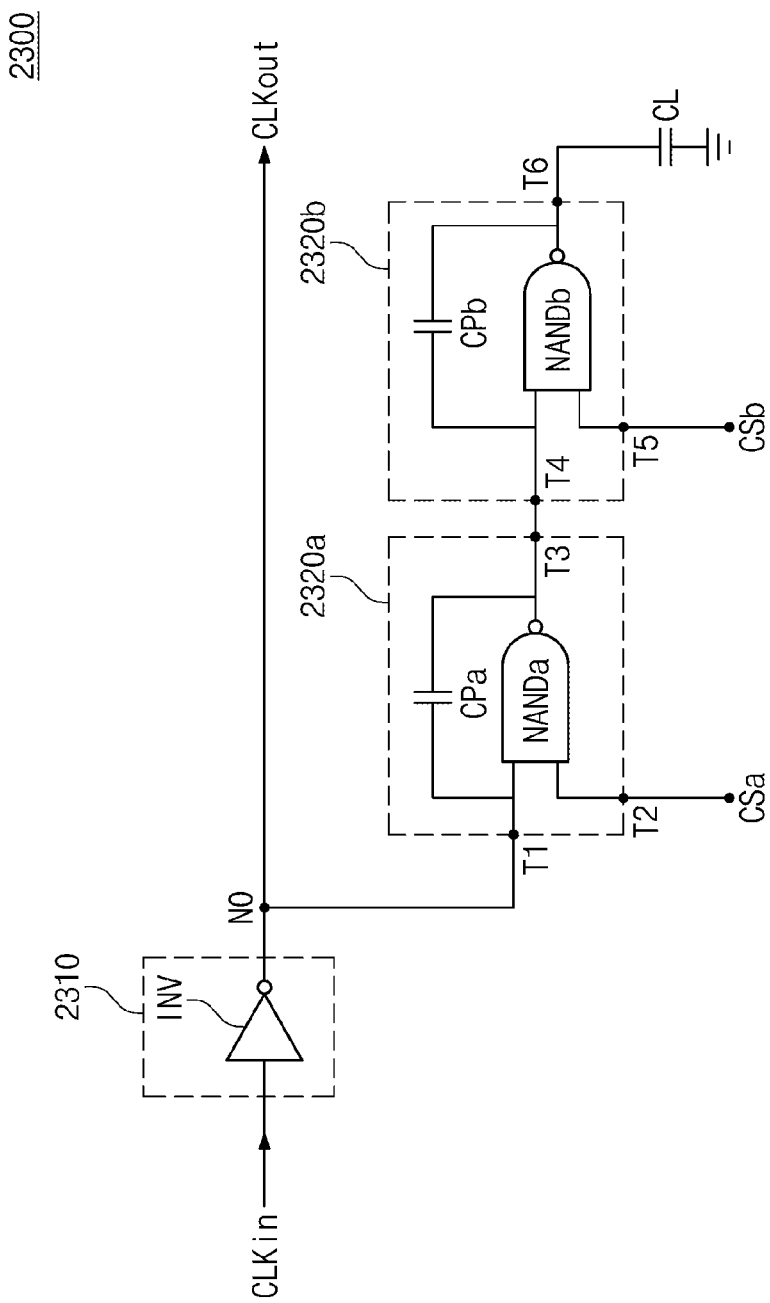
FIG. 7 illustrates a circuit diagram in which a phase correction circuit of FIG. 5B is implemented, according to an embodiment of the present disclosure.

FIG. 7 illustrates a circuit diagram in which a phase correction circuit of FIG. 5B is implemented, according to an embodiment of the present disclosure. Referring to FIGS. 5B and 7, a phase correction circuit 2300 may include a delay circuit 2310 and first and second fine tuning circuits 2320a and 2320b. The delay circuit 2310 may include an inverter INV. However, the present disclosure is not limited thereto. For example, the delay circuit 2310 may include one or more inverters INV or may include a buffer defined, for example, by a pair of serially-connected inverters.

The functions and the operations of the phase correction circuit 2300, the delay circuit 2310, and the first and second fine tuning circuits 2320a and 2320b are similar to those of the phase correction circuit 1300, the delay circuit 1310, and the first and second fine tuning circuit 1320a and 1320b of FIG. 5B, and thus, additional description will be omitted to avoid redundancy.

Below, an embodiment in which each of fine tuning circuits is implemented with a NAND gate will be described with reference to FIGS. 7 to 9. However, the present disclosure is not limited thereto. For example, the present disclosure may include embodiments in which the fine tuning circuits 2320a and 2320b are implemented with any other semiconductor components. Embodiments in which a logic circuit is implemented with various components will be described in detail with reference to FIGS. 11 and 12.

The first fine tuning circuit 2320a may include the first terminal T1 connected with the 0-th node NO, the second terminal T2 receiving the first control signal CSa, and the third terminal T3. The second fine tuning circuit 2320b may include the fourth terminal T4 connected with the third terminal T3, the fifth terminal T5 receiving the second control signal CSb, and the sixth terminal T6. The sixth terminal T6 may be connected with the load capacitor CL. In an embodiment, the first fine tuning circuit 2320a may be implemented with a first NAND gate NANDa. In this case, the first terminal T1 and the second terminal T2 may correspond to input terminals of the first NAND gate NANDa, respectively. The third terminal T3 may correspond to an output terminal of the first NAND gate NANDa. In an embodiment, the second fine tuning circuit 2320b may be implemented with a second NAND gate NANDb. In this case, the fourth terminal T4 and the fifth terminal T5 may correspond to input terminals of the second NAND gate NANDb, respectively. The sixth terminal T6 may correspond to an output terminal of the second NAND gate NANDb.

The first fine tuning circuit 2320a and the second fine tuning circuit 2320b may include a first parasitic capacitance CPa and a second parasitic capacitance CPb, respectively. In an embodiment, the first and second parasitic capacitances CPa and CPb may mean parasitic capacitances of the first NAND gate NANDa and the second NAND gate NANDb, respectively. For example, the first parasitic capacitance CPa may mean a "built-in" parasitic capacitance caused by transistors that are included in the first NAND gate NANDa. The parasitic capacitance may be caused by a non-ideality of a NAND gate or a transistor.

In an embodiment, in the case where the first control signal CSa or the second control signal CSb is activated, the corresponding fine tuning circuit 2320a or 2320b may perform the similar operation as the inverter. For example, when the first control signal CSa is activated, a signal that is output to the third terminal T3 may be the same as a signal obtained by inverting a signal input to the first terminal T1. That is, the first NAND gate NANDa may perform an operation that is similar to an operation of an inverter or an amplifier with a gain of −1. In this case, a change of the output clock signal CLKout will be described in detail with reference to FIGS. 8A, 8B, and 9.

In an embodiment, when the first control signal CSa or the second control signal CSb is activated, an equivalent capacitance seen from the delay circuit 2310 to the 0-th node NO may be increased or decreased based on the Miller effect. Accordingly, the phase of the output clock signal CLKout may change in response to the activation of the first control signal CSa or the second control signal CSb. The Miller effect will be described in detail with reference to FIGS. 8A and 8B. An equivalent operation of the phase correction circuit 2300 based on the Miller effect will be described in detail with reference to FIG. 9.

Figure 8A:
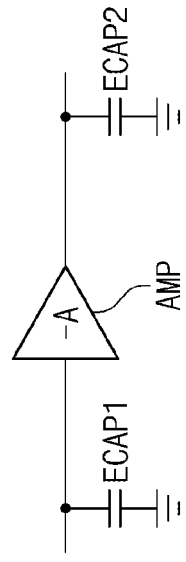
FIGS. 8A and 8B are circuit diagrams for describing a Miller effect.
Figure 8B:
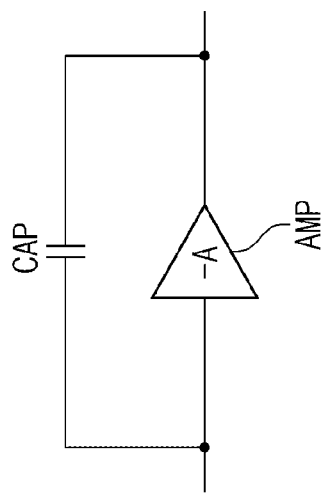

FIGS. 8A and 8B are circuit diagram for describing the Miller effect. Referring to FIG. 8A, in the case where a capacitance CAP and an amplifier AMP whose gain is negative (e.g., is −A) are connected in parallel, the Miller effect may occur. For example, the capacitance CAP is connected between an input terminal and an output terminal of the amplifier AMP, the Miller effect may occur. However, the present disclosure is not limited thereto. A resistive load, a capacitive load, an inductive load, and/or a load corresponding to a combination thereof may be connected in parallel with the amplifier AMP.

Referring to FIG. 8B, the capacitance CAP connected in parallel with the amplifier AMP may be equivalently expressed by a first equivalent capacitance ECAP1 and a second equivalent capacitance ECAP2. The first equivalent capacitance ECAP1 may be expressed as connected with the input terminal of the amplifier AMP. The second equivalent capacitance ECAP2 may be expressed as connected with the output terminal of the amplifier AMP. A relationship between magnitudes of the first equivalent capacitance ECAP1 and the second equivalent capacitance ECAP2 may be expressed by Equation 1.

$$ECAP1 = (1 + A) \times C \qquad \text{[Equation 1]}$$
$$ECAP2 = \left(1 + \frac{1}{A}\right) \times C$$

In an embodiment, "A" may represent a gain of an amplifier, "C" may represent a magnitude of the capacitance CAP connected between the input terminal and the output terminal of the amplifier AMP.

In an embodiment, the capacitance CAP of FIG. 8A may correspond to the first parasitic capacitance CPa or the second parasitic capacitance CPb of FIG. 7. That is, in response to that the control signal CS is activated, the equivalent magnitude of the first and second parasitic capacitances CPa and CPb may be amplified by the Miller effect. In this case, a change of the output clock signal CLKout will be described in detail with reference to FIG. 9.

Figure 9:
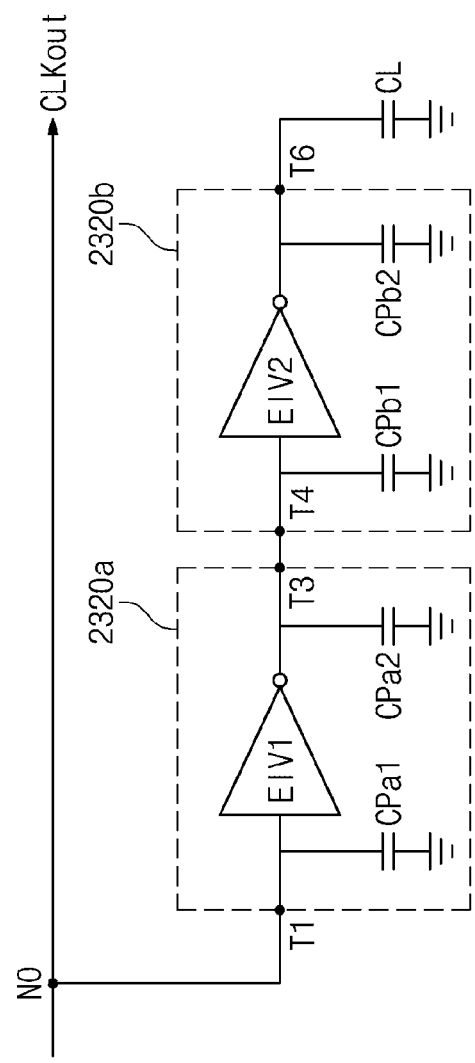
FIG. 9 is a circuit diagram equivalently illustrating a fine tuning circuit when a control signal of FIG. 7 is activated.

FIG. 9 is a circuit diagram equivalently illustrating a fine tuning circuit when the multi-bit control signal of FIG. 7 is activated. Below, for brief description, the case where both the first control signal CSa and the second control signal CSb of FIG. 7 are activated will be described, but the present disclosure is not limited thereto. For example, the first control signal CSa and the second control signal CSb may be independently activated or may not be activated depending on a magnitude of a phase of the input clock signal CLKin, which is to be corrected. That is, the scope of the present disclosure may include both the case where the first control signal CSa is activated and the second control signal CSb is not activated and the case where the first control signal CSa is not activated and the second control signal CSb is activated.

Referring to FIGS. 7 to 9, in response to that the first control signal CSa is activated, the first NAND gate NANDa may operate to be equivalent to a first equivalent inverter EIV1. In this case, based on the Miller effect, the first parasitic capacitance CPa may operate to be equivalent to a first input Miller capacitance CPa1 and a first output Miller capacitance CPa2.

In an embodiment, the first input Miller capacitance CPa1 may be greater than the first parasitic capacitance CPa. For example, the first equivalent inverter EIV1 may perform an operation similar to that of an amplifier whose gain is −1. Accordingly, referring to Equation 1 above, because "A" is 1', a magnitude of the first input Miller capacitance CPa1 may be about two times the magnitude of the first parasitic capacitance CPa.

In response to that the second control signal CSb is activated, the second NAND gate NANDb may operate to be equivalent to a second equivalent inverter EIV2. In this case, based on the Miller effect, the second parasitic capacitance CPb may operate to be equivalent to a second input Miller capacitance CPb1 and a second output Miller capacitance CPb2.

In an embodiment, the second input Miller capacitance CPb1 may be greater than the second parasitic capacitance CPb. For example, the second equivalent inverter EIV2 may perform an operation similar to that of an amplifier whose gain is −1. Accordingly, referring to Equation 1 above, because "A" is 1', a magnitude of the second input Miller capacitance CPb1 may be about two times the magnitude of the second parasitic capacitance CPb.

In an embodiment, when the first control signal CSa is activated, a magnitude of an equivalent capacitance seen from the delay circuit 2310 to the 0-th node N0 may be increased based on the Miller effect for the first parasitic capacitance CPa. For example, because the first input Miller capacitance CPa1 greater than the first parasitic capacitance CPa is equivalently connected with the 0-th node N0, a time constant (e.g., RC time constant) of a circuit may increase. Accordingly, when the first control signal CSa is activated, the phase of the output clock signal CLKout may be finely tuned.

In an embodiment, when the second control signal CSb is activated, the phase of the output clock signal CLKout may be tuned more finely based on the Miller effect for the second parasitic capacitance CPb. For example, a magnitude of the phase of the output clock signal CLKout, which is tuned when the second control signal CSb is activated, may be smaller than a magnitude of the phase of the output clock signal CLKout, which is tuned when the first control signal CSa is activated.

According to an embodiment of the present disclosure, the unintended influence due to the parasitic capacitance may be minimized. For example, unlike the embodiment described with reference to FIG. 6, according to the embodiment described with reference to FIGS. 7 to 9, the influence of the parasitic capacitances CPa and CPb on the output clock signal CLKout may be controlled through combinations of whether to activate the control signals CSa and CSb. Accordingly, a phase correction circuit in which the influence of the parasitic capacitance is minimized and a phase interpolating device including the same may be provided.

According to an embodiment of the present disclosure, a high resolution phase correcting circuit capable of fine-turning the phase of the output clock signal CLKout and a device including the same may be provided. For example, compared to the case where a conventional phase correction circuit has a resolution of about 3 picosecond (ps), the phase correction circuit according to an embodiment of the present disclosure may have a resolution of about 0.05 ps.

In an embodiment, in the case where one or more fine tuning circuits are further connected, a phase correcting circuit capable of tuning a phase more finely and a phase interpolating device including the same may be provided. For example, as in the description given with reference to FIG. 5B, the phase correction circuit 2300 may further include a third fine tuning circuit (not illustrated) connected with the sixth terminal T6.

Figure 10:
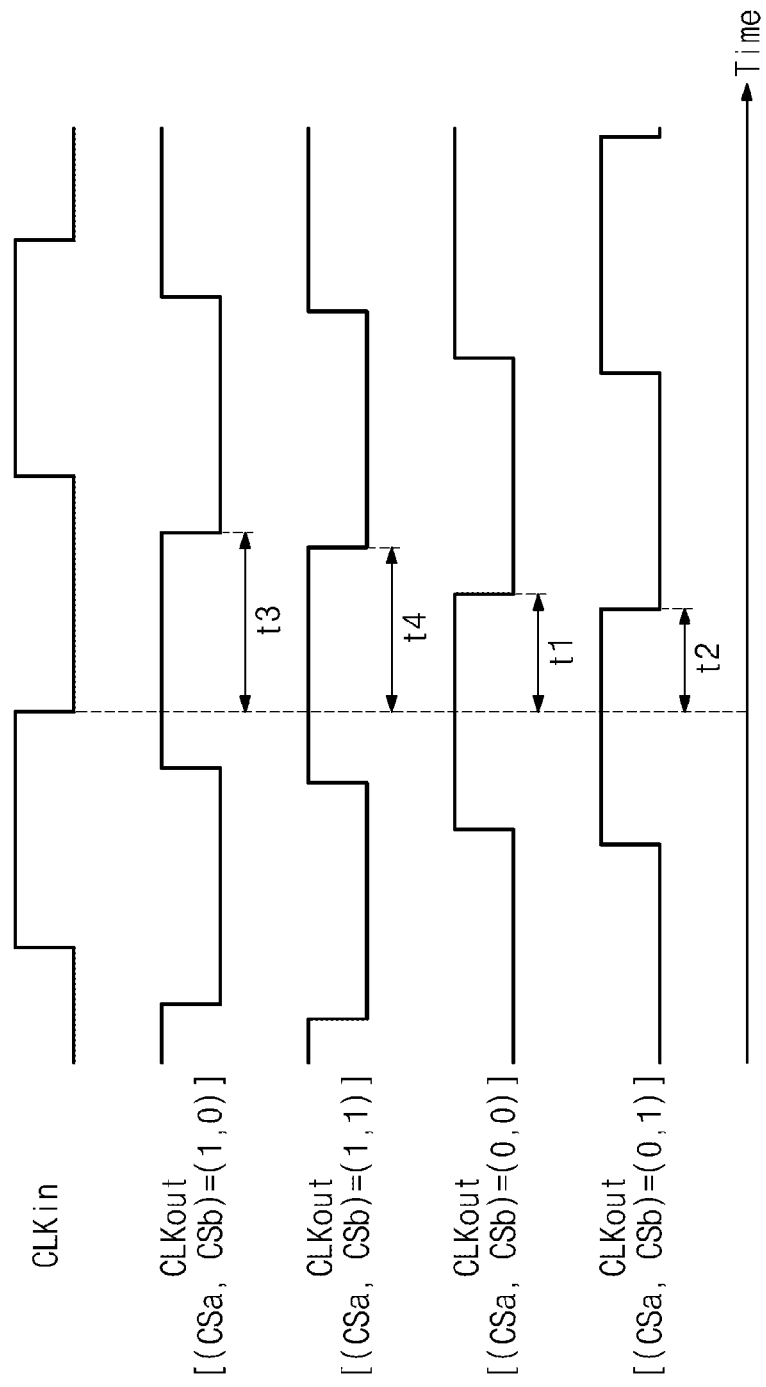
FIG. 10 is a timing diagram illustrating a phase of an output clock signal of FIG. 7.

FIG. 10 is a timing diagram illustrating a phase of an output clock signal of FIG. 7. Referring to FIGS. 7, 9, and 10, the phase of the output clock signal CLKout may be finely tuned in response to the first control signal CSa and the second control signal CSb. For brief description, additional description associated with how the phase of the output clock signal CLKout is finely tuned, which is described with reference to FIG. 9, is omitted.

When both the first control signal CSa and the second control signal CSb are deactivated (e.g., when (CSa, CSb)=(0, 0)), the output clock signal CLKout may be a signal obtained by delaying the input clock signal CLKin as much as a first delay time t1.

When the first control signal CSa is deactivated and the second control signal CSb is activated (e.g., when (CSa, CSb)=(0, 1)), the output clock signal CLKout may be a signal obtained by delaying the input clock signal CLKin as much as a second delay time t2. And, when the first control signal CSa is activated and the second control signal CSb is deactivated (e.g., when (CSa, CSb)=(1, 0)), the output clock signal CLKout may be a signal obtained by delaying the input clock signal CLKin as much as a third delay time t3. Finally, when the first control signal CSa and the second control signal CSb are activated (e.g., when (CSa, CSb)=(1, 1)), the output clock signal CLKout may be a signal obtained by delaying the input clock signal CLKin as much as a fourth delay time t4.

In an embodiment, when the first control signal CSa is activated, the phase of the output clock signal CLKout may be delayed. For example, a magnitude of the third delay time t3 may be greater than a magnitude of the first delay time t1. A magnitude of the fourth delay time t4 may be greater than a magnitude of the second delay time t2.

In an embodiment, when the second control signal CSb is activated, the phase of the output clock signal CLKout may be advanced. For example, a magnitude of the second delay time t2 may be smaller than the magnitude of the first delay time t1. The magnitude of the fourth delay time t4 may be smaller than the magnitude of the third delay time t3.

In an embodiment, a magnitude of the phase of the output clock signal CLKout, which is tuned when the second control signal CSb is activated, may be smaller than a magnitude of the phase of the output clock signal CLKout, which is tuned when the first control signal CSa is activated. For example, a magnitude difference between the first delay time t1 and the third delay time t3 may be greater than a magnitude difference between the first delay time t1 and the second delay time t2. A magnitude difference between the fourth delay time t4 and the second delay time t2 may be greater than a magnitude difference between the fourth delay time t4 and the third delay time t3.

However, the above relationship of the phases of the output clock signal CLKout, which are differently determined depending on whether the first control signal CSa and the second control signal CSb are activated, is an example, and the present disclosure is not limited thereto. For example, it may be well understood to one skilled in the art that the phase of the output clock signal CLKout may vary depending on a kind or a magnitude of a load connected with the sixth terminal T6.

Figure 11:
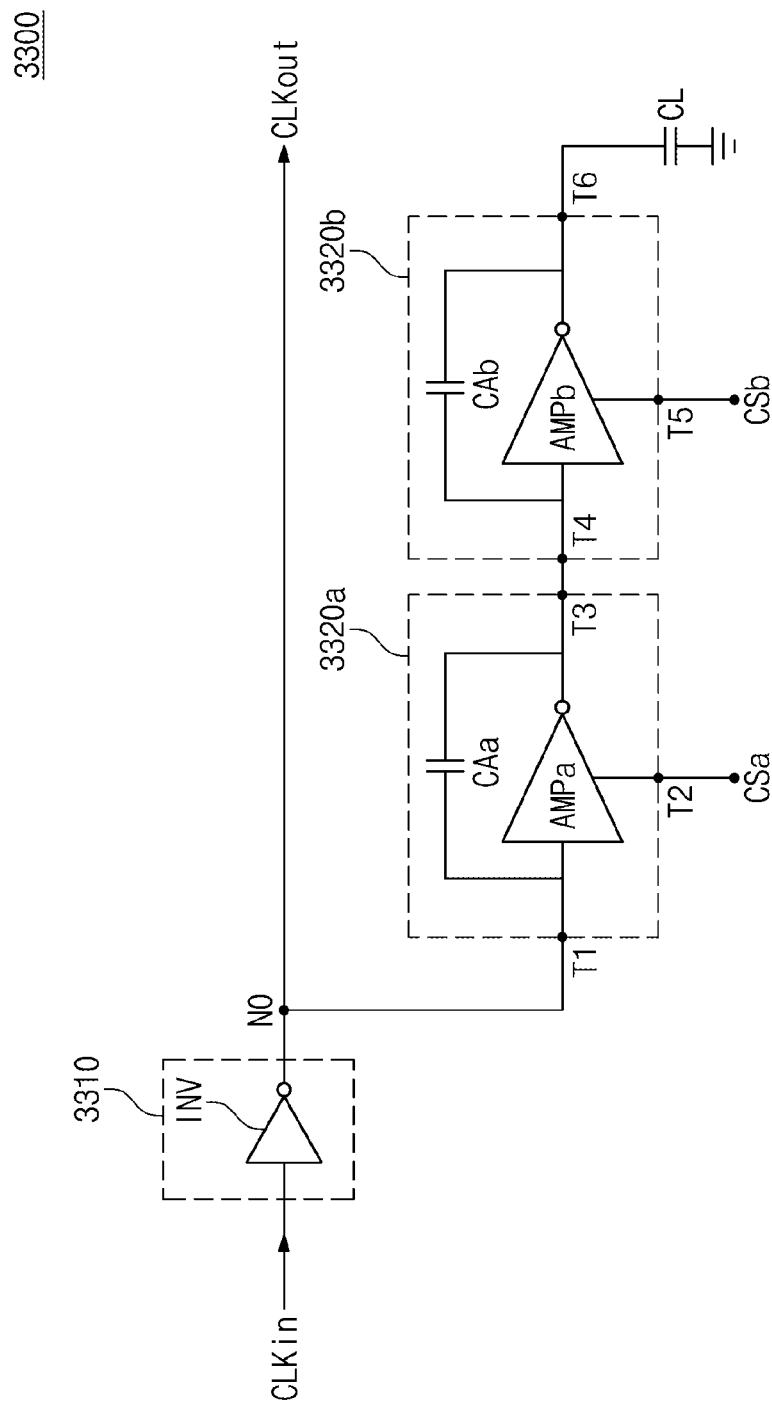
FIG. 11 is a circuit diagram in which a phase correction circuit of FIG. 5B is implemented, according to an embodiment of the present disclosure.

FIG. 11 is a circuit diagram in which a phase correction circuit of FIG. 5B is implemented, according to an embodiment of the present disclosure. Referring to FIGS. 5B and 11, a phase correction circuit 3300 may include a delay circuit 3310, a first fine tuning circuit 3320a, and a second fine tuning circuit 3320b. The delay circuit 3310 may include the inverter INV. However, the present disclosure is not limited thereto. The delay circuit 3310 may include one or more inverters INV or may include a buffer. In some embodiments, a buffer may be defined by a pair of serially-connected inverters.

The functions and the operations of the phase correction circuit 3300, the delay circuit 3310, and the first and second fine tuning circuits 3320a and 3320b are similar to those of the phase correction circuit 1300, the delay circuit 1310, and the first and second fine tuning circuit 1320a and 1320b of FIG. 5B, and thus, additional description will be omitted to avoid redundancy.

The first fine tuning circuit 3320a may include the first terminal T1, the second terminal T2, and the third terminal T3. The second fine tuning circuit 3320b may include the fourth terminal T4, the fifth terminal T5, and the sixth terminal T6. A connection relationship of the first fine tuning circuits 3320a and the second fine tuning circuit 3320b is similar to that described with reference to FIG. 5B or 7, and thus, additional description will be omitted to avoid redundancy.

In an embodiment, the first fine tuning circuit 3320a may be implemented with a first amplifier AMPa. In this case, the first terminal T1 may correspond to an input terminal of the first amplifier AMPa. The second terminal T2 may correspond to a power terminal of the first amplifier AMPa. The third terminal T3 may correspond to an output terminal of the first amplifier AMPa. The first amplifier AMPa may include a first amplifier parasitic capacitance CAa. The first amplifier parasitic capacitance CAa may mean a parasitic capacitance caused by transistors included in the first amplifier AMPa.

In an embodiment, the second fine tuning circuit 3320b may be implemented with a second amplifier AMPb. In this case, the fourth terminal T4 may correspond to an input terminal of the second amplifier AMPb. The fifth terminal T5 may correspond to a power terminal of the second amplifier AMPb. The sixth terminal T6 may correspond to an output terminal of the second amplifier AMPb. The second amplifier AMPb may include a second amplifier parasitic capacitance CAb. The second amplifier parasitic capacitance CAb may mean a parasitic capacitance caused by transistors included in the second amplifier AMPb. In an embodiment, each of the first amplifier AMPa and the second amplifier AMPb may be a voltage amplifier. However, the present disclosure is not limited thereto. Various types of amplifiers may be included.

The first amplifier AMPa may be turned on or turned off in response to the first control signal CSa. For example, when the first control signal CSa is at the high level, the first amplifier AMPa may operate as an amplifier whose gain is negative (e.g., is −A1). In this case, based on the Miller effect, the phase of the output clock signal CLKout may be tuned based on the first amplifier parasitic capacitance CAa. The principle that the phase of the output clock signal CLKout is tuned in response to the first control signal CSa is similar to that described with reference to FIGS. 7 to 9, and thus, additional description will be omitted to avoid redundancy.

The second amplifier AMPb may be turned on or turned off in response to the second control signal CSb. For example, when the second control signal CSb is at the high level, the second amplifier AMPb may operate as an amplifier whose gain is negative (e.g., is −A2). In this case, based on the Miller effect, the phase of the output clock signal CLKout may be tuned based on the second amplifier parasitic capacitance CAb. The principle that the phase of the output clock signal CLKout is adjustably tuned in response to the second control signal CSb is similar to that described with reference to FIGS. 7 to 9, and thus, additional description will be omitted to avoid redundancy.

In an embodiment, a magnitude of the phase of the output clock signal CLKout, which is tuned when the second control signal CSb is activated, may be smaller than a magnitude of the phase of the output clock signal CLKout, which is tuned when the first control signal CSa is activated.

Figure 12:
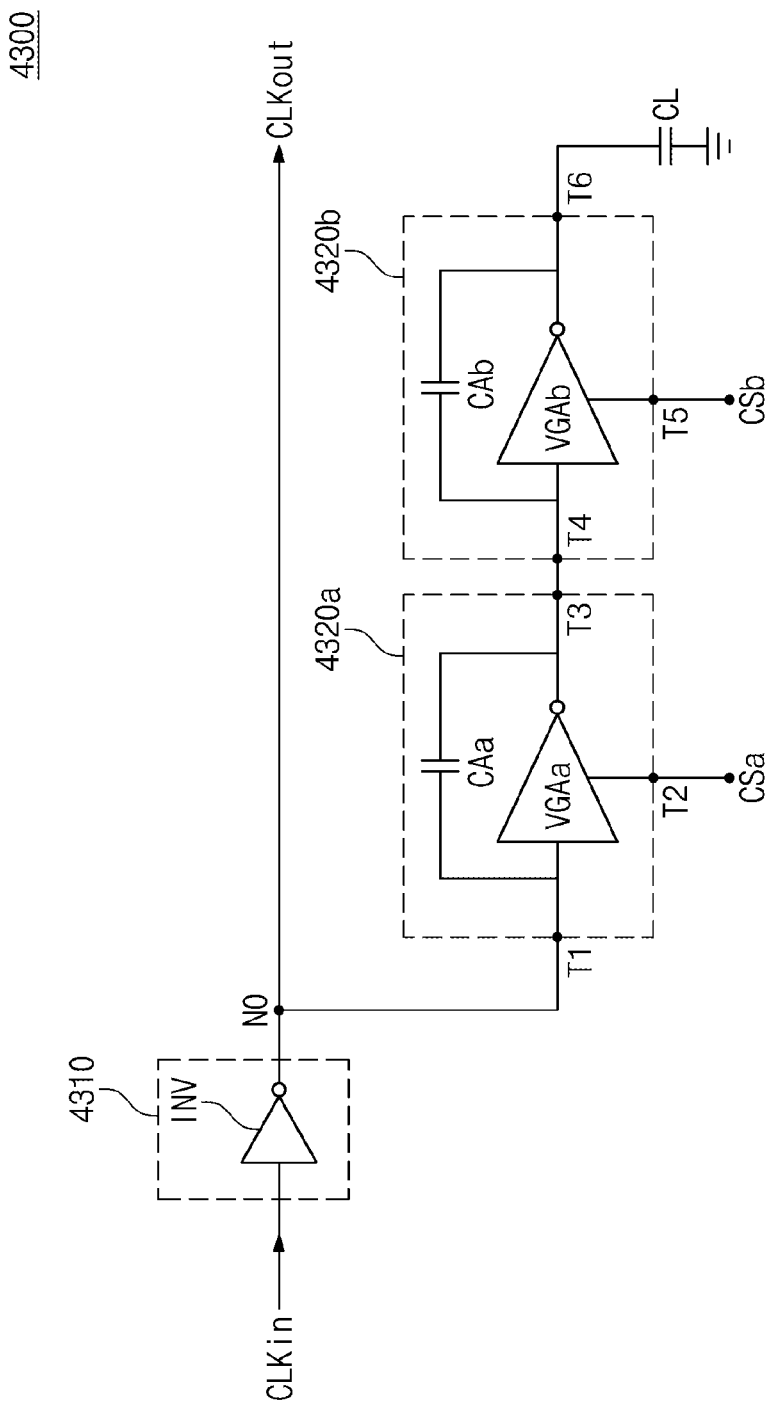
FIG. 12 is a circuit diagram in which a phase correction circuit of FIG. 5B is implemented, according to an embodiment of the present disclosure.

FIG. 12 is a circuit diagram in which a phase correction circuit of FIG. 5B is implemented, according to an embodiment of the present disclosure. Referring to FIGS. 5B and 12, a phase correction circuit 4300 may include a delay circuit 4310, a first fine tuning circuit 4320a, and a second fine tuning circuit 4320b. The delay circuit 4310 may include the inverter INV. However, the present disclosure is not limited thereto. The delay circuit 4310 may include one or more inverters INV or may include a buffer.

The functions and the operations of the phase correction circuit 4300, the delay circuit 4310, and the first and second fine tuning circuits 4320a and 4320b are similar to those of the phase correction circuit 1300, the delay circuit 1310, and the first and second fine tuning circuit 1320a and 1320b of FIG. 5B, and thus, additional description will be omitted to avoid redundancy.

The first fine tuning circuit 4320a may include the first terminal T1, the second terminal T2, and the third terminal T3. The second fine tuning circuit 4320b may include the fourth terminal T4, the fifth terminal T5, and the sixth terminal T6. A connection relationship of the first fine tuning circuit 4320a and the second fine tuning circuit 4320b is similar to that described with reference to FIG. 5B or 7, and thus, additional description will be omitted to avoid redundancy.

In an embodiment, the first fine tuning circuit 4320a may be implemented with a first variable gain amplifier VGAa. In this case, the first terminal T1 may correspond to an input terminal of the first variable gain amplifier VGAa. The second terminal T2 may correspond to a gain-control terminal of the first variable gain amplifier VGAa. The third terminal T3 may correspond to an output terminal of the first variable gain amplifier VGAa. The first variable gain amplifier VGAa may include the first amplifier parasitic capacitance CAa.

In an embodiment, the second fine tuning circuit 4320b may be implemented with a second variable gain amplifier VGAb. In this case, the fourth terminal T4 may correspond to an input terminal of the second variable gain amplifier VGAb. The fifth terminal T5 may correspond to a gain-control terminal of the second variable gain amplifier VGAb. The sixth terminal T6 may correspond to an output terminal of the second variable gain amplifier VGAb. The second variable gain amplifier VGAb may include the second amplifier parasitic capacitance CAb. The first amplifier parasitic capacitance CAa may mean a parasitic capacitance caused by transistors included in the first variable gain amplifier VGAa, and the second amplifier parasitic capacitance CAb may mean a parasitic capacitance caused by transistors included in the second variable gain amplifier VGAb.

The first variable gain amplifier VGAa may be an amplifier whose gain (e.g., −VG1) is variable in response to the first control signal CSa. According to Equation 1 above, for example, when the gain increases or decreases in response to the first control signal CSa, a magnitude of the equivalent capacitance (based on the Miller effect) may change. Accordingly, the phase of the output clock signal CLKout may be tuned in response to the change of the first control signal CSa.

The second variable gain amplifier VGAb may be an amplifier whose gain (e.g., −VG2) is variable in response to the second control signal CSb. According to Equation 1 above, for example, when the gain increases or decreases in response to the second control signal CSb, a magnitude of the equivalent capacitance (based on the Miller effect) may change. Accordingly, the phase of the output clock signal CLKout may be tuned in response to the change of the second control signal CSb.

In an embodiment, a magnitude of the phase of the output clock signal CLKout, which is tuned in response to the change of the second control signal CSb, may be smaller than a magnitude of the phase of the output clock signal CLKout, which is tuned in response to the change of the first control signal CSa.

In an embodiment, each of the first and second variable gain amplifiers VGAa and VGAb may increase or decrease a gain in response to a change in a voltage provided by the corresponding control signal. Alternatively, each of the first and second variable gain amplifiers VGAa and VGAb may increase or decrease a gain in response to a duty ratio of a control signal provided in a pulse width modulation (PWM) manner. However, the present disclosure is not limited thereto. For example, a variable gain amplifier whose gain increases or decreases in response to a change of a control signal may be provided.

Figure 13:
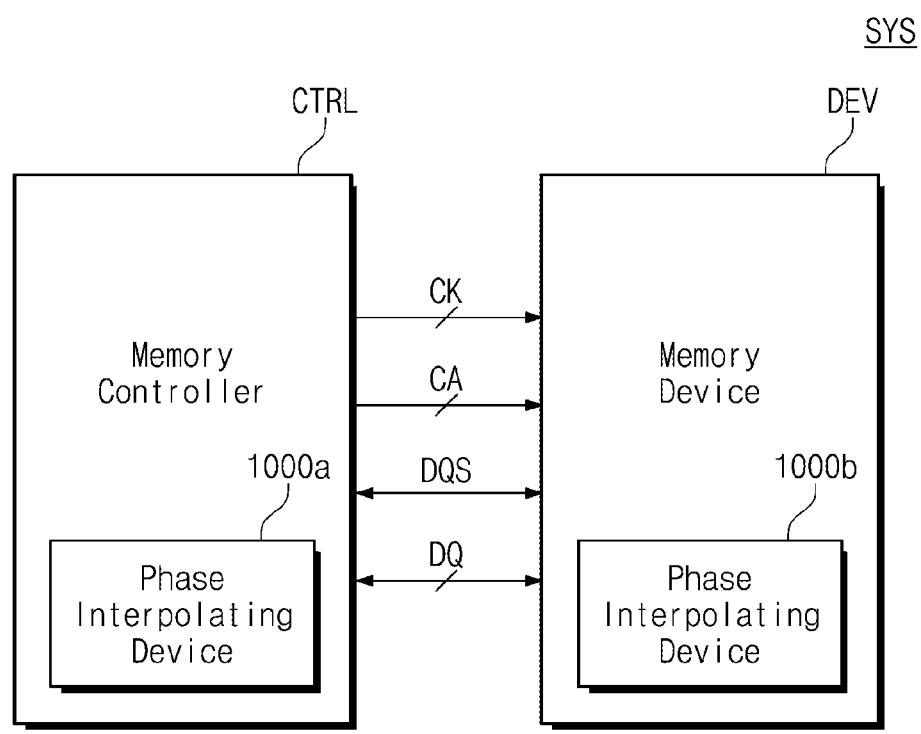
FIG. 13 is a block diagram illustrating a memory system including a phase interpolating device described above.

FIG. 13 is a block diagram illustrating a memory system including a phase interpolating device described above. Referring to FIG. 13, a memory system SYS may include a memory controller CTRL and a memory device DEV. The memory controller CTRL may include a first phase interpolating device 1000a. The memory device DEV may include a second phase interpolating device 1000b. However, the present disclosure is not limited thereto. The application to various electronic devices using a clock signal may be possible.

For brief description, it is assumed that the memory device DEV is a dynamic random access memory (DRAM) and the memory controller CTRL and the memory device DEV communicate with each other based on a double data rate (DDR) interface. However, the present disclosure is not limited thereto. For example, the memory device DEV may be one of various memory devices such as a static random access memory (SRAM), a synchronous DRAM (SDRAM), a magnetic RAM (MRAM), a ferroelectric RAM (FRAM), a resistive RAM (ReRAM), and a phase-change RAM (PRAM), and the memory controller CTRL and the memory device DEV may communicate with each other based on one of various interfaces such as a low power double data rate (LPDDR) interface, a universal serial bus (USB) interface, a multimedia card (MMC) interface, a peripheral component interconnect (PCI) interface, a peripheral component interconnect express (PCI-e) interface, an advanced technology attachment (ATA) interface, a serial ATA (SATA) interface, a parallel ATA (PATA) interface, a small computer system interface (SCSI), and an enhanced small disk interface (ESDI).

The memory controller CTRL may send the clock signal CLK. The memory controller CTRL may send a command/address CA to the memory device DEV. The memory controller CTRL may perform a read or write operation on the memory device DEV. In this case, the memory controller CTRL may exchange a data signal DQ with the memory device DEV. A data strobe signal DQS may be synchronized with the data signal DQ.

In an embodiment, the first phase interpolating device 1000a may generate the clock signal CLK based on a clock signal (not illustrated) generated in the memory controller CTRL and the data signal DQ. In this case, the clock signal CLK may correspond to the corrected clock signal CCLK of FIG. 1.

In an embodiment, the second phase interpolating device 1000b may generate an internal clock signal of the memory device DEV, based on the data signal DQ and the clock signal CLK. The memory device DEV may synchronize the data strobe signal DQS with the data signal DQ based on the internal clock signal.

According to the present disclosure, a high resolution phase correcting circuit and a phase interpolating device, which are capable of fine-turning a phase of a clock signal, may be provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A phase correcting circuit, comprising:
a delay circuit configured to receive an input clock signal and to delay the input clock signal as much as a first delay time to output an output clock signal to a 0-th node;
a first fine tuning circuit including a first terminal connected with the 0-th node, a second terminal receiving a first control signal, and a third terminal; and
a second fine tuning circuit including a fourth terminal connected with the third terminal, a fifth terminal receiving a second control signal, and a sixth terminal connected with a load capacitor;
wherein, in response to the first control signal, the output clock signal is further delayed as much as a second delay time shorter than the first delay time; and
wherein, in response to the second control signal, the output clock signal is advanced as much as a third delay time shorter than the first delay time; and
wherein a magnitude of the third delay time is smaller than a magnitude of the second delay time.

2. The phase correcting circuit of claim 1, wherein the delay circuit includes one or more inverters.

3. The phase correcting circuit of claim 1,
wherein the first fine tuning circuit includes a first NAND gate, and the second fine tuning circuit includes a second NAND gate;
wherein the first terminal corresponds to a first input terminal of the first NAND gate, the second terminal corresponds to a second input terminal of the first NAND gate, and the third terminal corresponds to a first output terminal of the first NAND gate; and
wherein the fourth terminal corresponds to a third input terminal of the second NAND gate, the fifth terminal corresponds to a fourth input terminal of the second NAND gate, and the sixth terminal corresponds to a second output terminal of the second NAND gate.

4. The phase correcting circuit of claim 1,
wherein the first fine tuning circuit includes a first amplifier, and the second fine tuning circuit includes a second amplifier;
wherein the first terminal corresponds to a first input terminal of the first amplifier, the second terminal corresponds to a first power terminal of the first amplifier, and the third terminal corresponds to a first output terminal of the first amplifier;
wherein the fourth terminal corresponds to a second input terminal of the second amplifier, the fifth terminal corresponds to a second power terminal of the second amplifier, and the sixth terminal corresponds to a second output terminal of the second amplifier; and
wherein the first amplifier is configured to be turned on in response to activation of the first control signal, and the second amplifier is configured to be turned on in response to activation of the second control signal.

5. The phase correcting circuit of claim 4, wherein a gain of each of the first amplifier and the second amplifier is negative.

6. The phase correcting circuit of claim 1,
wherein the first fine tuning circuit includes a first variable gain amplifier, and the second fine tuning circuit includes a second variable gain amplifier;
wherein the first terminal corresponds to a first input terminal of the first variable gain amplifier, the second terminal corresponds to a first gain-control terminal of the first variable gain amplifier, and the third terminal corresponds to a first output terminal of the first variable gain amplifier; and
wherein the fourth terminal corresponds to a second input terminal of the second variable gain amplifier, the fifth terminal corresponds to a second gain-control terminal of the second variable gain amplifier, and the sixth terminal corresponds to a second output terminal of the second variable gain amplifier.

7. A phase correcting circuit, comprising:
a delay circuit configured to receive an input clock signal and to delay the input clock signal as much as a first delay time to output an output clock signal to a 0-th node;
a load capacitor; and
one or more fine tuning circuits connected in series between the 0-th node and the load capacitor;
wherein each of the one or more fine tuning circuits includes an input terminal, a control terminal, and an output terminal;
wherein the input terminal is connected with the 0-th node or an output terminal of a previous fine tuning circuit, the control terminal receives a control signal, and the output terminal is connected with an input terminal of a next fine tuning circuit or the load capacitor;
wherein, in response to the control signal, a phase of the output clock signal is tuned as much as a second delay time shorter than the first delay time;
wherein each of the one or more fine tuning circuits includes an amplifier; and
wherein the input terminal corresponds to an input terminal of the amplifier, the control terminal corresponds to a power terminal of the amplifier, and the output terminal corresponds to an output terminal of the amplifier.

8. The phase correcting circuit of claim 7, wherein the delay circuit includes one or more inverters.

9. The phase correcting circuit of claim 7, wherein the control signals, which are each input to respective ones of the fine tuning circuits through the second terminal, are different from each other.

10. The phase correcting circuit of claim 9, wherein a magnitude of the phase of the output clock signal, which is to be tuned, varies in response to the different control signals.

11. The phase correcting circuit of claim 7, wherein each of the one or more fine tuning circuits includes a NAND gate; and wherein the input terminal corresponds to a first input terminal of the NAND gate, the control terminal corresponds to a second input terminal of the NAND gate, and the output terminal corresponds to an output terminal of the NAND gate.

12. The phase correcting circuit of claim 7, wherein a gain of the amplifier is negative.

13. The phase correcting circuit of claim 7, wherein the amplifier is a variable gain amplifier.

14. A phase interpolating device, comprising:
a decoder configured to generate a first control signal and a second control signal based on a phase difference of a clock signal and a reference signal;
a phase shift unit including a plurality of phase correction circuits connected in series; and
a phase select unit;
wherein each of the plurality of phase correction circuits includes:
a delay circuit configured to receive an input clock signal and to delay the input clock signal as much as a first delay time to output an output clock signal to an output node;
a first fine tuning circuit including a first terminal connected with the output node, a second terminal receiving the first control signal, and a third terminal; and
a second fine tuning circuit including a fourth terminal connected with the third terminal, a fifth terminal receiving the second control signal, and a sixth terminal connected with a load capacitor;
wherein, in response to the first control signal, the output clock signal is further delayed as much as a second delay time shorter than the first delay time;
wherein, in response to the second control signal, the output clock signal is advanced as much as a third delay time shorter than the first delay time; and
wherein the phase select unit is configured to determine whether to select, as a corrected clock signal, an output clock signal output from the delay circuit of each of the plurality of phase correction circuits, based on the phase difference.

15. The phase interpolating device of claim 14,
wherein the first fine tuning circuit includes a first NAND gate, and the second fine tuning circuit includes a second NAND gate;
wherein the first terminal corresponds to a first input terminal of the first NAND gate, the second terminal corresponds to a second input terminal of the first NAND gate, and the third terminal corresponds to a first output terminal of the first NAND gate; and
wherein the fourth terminal corresponds to a third input terminal of the second NAND gate, the fifth terminal corresponds to a fourth input terminal of the second NAND gate, and the sixth terminal corresponds to a second output terminal of the second NAND gate.

16. The phase interpolating device of claim 14,
wherein the first fine tuning circuit includes a first amplifier, and the second fine tuning circuit includes a second amplifier;
wherein the first terminal corresponds to a first input terminal of the first amplifier, the second terminal corresponds to a first power terminal of the first amplifier, and the third terminal corresponds to a first output terminal of the first amplifier;
wherein the fourth terminal corresponds to a second input terminal of the second amplifier, the fifth terminal corresponds to a second power terminal of the second amplifier, and the sixth terminal corresponds to a second output terminal of the second amplifier;
wherein the first amplifier is configured to be turned on in response to activation of the first control signal; and
wherein the second amplifier is configured to be turned on in response to activation of the second control signal.

17. The phase interpolating device of claim 14,
wherein the first fine tuning circuit includes a first variable gain amplifier, and the second fine tuning circuit includes a second variable gain amplifier;
wherein the first terminal corresponds to a first input terminal of the first variable gain amplifier, the second terminal corresponds to a first gain-control terminal of the first variable gain amplifier, and the third terminal corresponds to a first output terminal of the first variable gain amplifier; and
wherein the fourth terminal corresponds to a second input terminal of the second variable gain amplifier, the fifth terminal corresponds to a second gain-control terminal of the second variable gain amplifier, and the sixth terminal corresponds to a second output terminal of the second variable gain amplifier.

18. The phase interpolating device of claim 14, wherein a magnitude of the third delay time is smaller than a magnitude of the second delay time.

* * * * *